United States Patent
Chang et al.

(10) Patent No.: US 6,194,265 B1
(45) Date of Patent: Feb. 27, 2001

(54) PROCESS FOR INTEGRATING HEMISPHERICAL GRAIN SILICON AND A NITRIDE-OXIDE CAPACITOR DIELECTRIC LAYER FOR A DYNAMIC RANDOM ACCESS MEMORY CAPACITOR STRUCTURE

(75) Inventors: Jung-Ho Chang, Uen-Lin; Hsi-Chuan Chen, Tainan; Dahcheng Lin, Hsin-Chu, all of (TW)

(73) Assignee: Vanguard International Semiconductor Corporation, Hsin-Chu (TW)

( * ) Notice: Subject to any disclaimer, the term of this patent is extended or adjusted under 35 U.S.C. 154(b) by 0 days.

(21) Appl. No.: 09/358,987

(22) Filed: Jul. 22, 1999

(51) Int. Cl.$^7$ ................................................ H01L 21/8242
(52) U.S. Cl. .......................... 438/255; 438/253; 438/254; 438/396; 438/397; 438/398
(58) Field of Search ..................................... 257/296, 306, 257/307, 308, 309; 438/253, 254, 255, 396, 397, 398

(56) References Cited

U.S. PATENT DOCUMENTS

| | | | |
|---|---|---|---|
| 5,340,765 | 8/1994 | Dennison et al. | 437/52 |
| 5,597,754 | 1/1997 | Lou et al. | 437/52 |
| 5,597,756 | 1/1997 | Fazan et al. | 437/52 |
| 5,622,889 | 4/1997 | Yoo et al. | 438/397 |
| 5,716,883 | 2/1998 | Tseng | 438/253 |
| 5,726,085 | 3/1998 | Crenshaw et al. | 438/255 |
| 5,728,618 | 3/1998 | Tseng | 438/253 |
| 5,763,306 | 6/1998 | Tsai | 438/255 |
| 5,913,119 | * 6/1999 | Lin et al. | 438/255 |
| 5,963,804 | * 10/1999 | Figura et al. | 438/255 |
| 6,037,219 | * 3/2000 | Lin et al. | 438/255 |

* cited by examiner

*Primary Examiner*—Mary Wilczewski
*Assistant Examiner*—Toniae M. Thomas
(74) *Attorney, Agent, or Firm*—George O. Saile; Stephen B. Ackerman

(57) ABSTRACT

A method of creating a DRAM capacitor structure, featuring a crown shaped storage node structure, has been developed. The crown shaped storage node structure, features the formation of an hemispherical grain, (HSG), silicon layer, only on a top portion of the structure, with the bottom portion of the crown shaped storage node structure, featuring non - HSG, or smooth surfaces. This configuration is achieved via creation of a capacitor opening, in a doped oxide - undoped oxide, composite insulator layer, used as the shape for subsequent formation of an amorphous silicon crown shaped structure. Selective removal of the overlying doped oxide layer, allows selective formation of an HSG silicon layer, only on the exposed top portion of the amorphous silicon crown shaped structure. Subsequent removal of the undoped oxide layer, exposes a bottom portion of the amorphous silicon crown shaped structure, featuring non - HSG silicon surfaces, allowing easier formation of a capacitor dielectric layer, specifically at the bottom corner of the crown shaped storage node structure.

24 Claims, 6 Drawing Sheets

PROCESS FOR INTEGRATING HEMISPHERICAL GRAIN SILICON AND A NITRIDE-OXIDE CAPACITOR DIELECTRIC LAYER FOR A DYNAMIC RANDOM ACCESS MEMORY CAPACITOR STRUCTURE

RELATED PATENT APPLICATION

"SELECTIVE GROWTH OF A HEMISPHERICAL GRAIN SILICON LAYER, ON THE OUTER SIDES OF A CROWN SHAPED DRAM CAPACITOR STRUCTURE", by D. C. Lin, J. H. Chang, H. C. Chen, of Vanguard International Semiconductor Corporation, invention disclosure—VIS87-022, (Feb. 13, 1998), assigned to a common assignee.

BACKGROUND OF THE INVENTION (1) Field of the Invention

The present invention relates to a method used to fabricate a dynamic random access memory, (DRAM), device, and more specifically to a method used to create a crown shaped capacitor structure, for the DRAM device.

(2) Description of the Prior Art

Device performance and cost reductions are the major objectives of the semiconductor industry. These objectives have been in part realized by the ability of the semiconductor industry to produce chips with sub-micron features, or micro-miniaturization. Smaller features allow the reduction in performance degrading capacitances and resistances to be realized. In addition smaller features result in a smaller chip, however still possessing the same level of integration obtained for semiconductor chips fabricated with larger features. This allows a greater number of the denser, smaller chips to be obtained from a specific size starting substrate, thus resulting in a lower manufacturing cost for an individual chip.

The use of smaller features, when used for the fabrication of dynamic random access memory, (DRAM), devices, in which the capacitor of the DRAM device is a stacked capacitor, (STC), structure, presents difficulties when attempting to increase STC capacitance. A DRAM cell is usually comprised of the STC structure, overlying a transfer gate transistor, and connected to the source of a source/drain of the transfer gate transistor. However the decreasing size of the transfer gate transistor, limits the dimensions of the STC structure. To increase the capacitance of the STC structure, comprised of two electrodes, separated by a dielectric layer, either the thickness of the dielectric layer has to be decreased, or the area of the capacitor has to be increased. The reduction in dielectric thickness is limited by increasing reliability and yield risks, encountered with ultra thin dielectric layers. In addition the area of the STC structure is limited by the area of the underlying transfer gate transistor dimensions. The advancement of the DRAM technology to densities of 256 million cells per chip, or greater, has resulted in a specific cell in which a smaller transfer gate transistor is being used, resulting in less of an overlying area for placement of overlying STC structures.

Two methods that can be used to increase STC capacitance, while still decreasing the lateral dimension of the capacitor, are the use of rough, or hemispherical grain (HSG), silicon layers, and the use of crown shaped capacitor structures. First, referring to the crown shaped capacitor structures, the creation of a polysilicon, or amorphous silicon, storage node structure, comprised of both vertical and horizontal silicon features, results in a greater electrode surface area than counterparts fabricated without vertical features. Secondly the use of an HSG silicon layer, comprised of convex and concave features, and used for the top layer of the storage node structure, again results in a greater degree of surface area than counterparts fabricated with smooth silicon layers. Therefore the combination of a crown shaped capacitor structure, comprised with a top layer of HSG silicon, residing on the crown shaped storage node structure, is an attractive option for high density DRAM devices.

The integration of a crown shaped storage node, and an overlying HSG silicon layer, can result in less than desirable results due to the selectivity needed between the HSG silicon layer, and the adjacent isolation regions, as well as the ability to create a capacitor dielectric layer at an HSG silicon-isolation interface, or corner. A silicon nitride layer, used for isolation between capacitor structures, as well as for an etch stop layer during an oxide recess procedure, is usually present between amorphous silicon, crown shaped structures, during the selective formation of an HSG silicon layer on the amorphous silicon, crown shaped storage node structure. However increased selectivity can be achieved, if a silicon oxide layer were used, in place of silicon nitride, between capacitor structures, thus improving DRAM device yield. This invention will offer a novel procedure for forming crown shaped storage node structures, featuring greater selectivity for HSG silicon formation, via use of an undoped silicon oxide isolation layer. In addition this invention will offer an improved procedure, for forming a nitride - oxide capacitor dielectric layer, specifically at the interface, or at a corner, in which the vertical feature of the crown shaped structure, comprised with an outer layer of HSG silicon, interfaces the isolation layer. Conventional procedures offer the HSG silicon layer directly interfacing the isolation region. However with this invention, the removal of the undoped silicon oxide layer, post HSG silicon formation, present a smooth, non-HSG silicon surface, at the corner between the vertical feature of the crown shaped structure and the isolation region, offering an interface, more conducive to subsequent capacitor dielectric formation. Prior art, such as Tseng, in U.S. Pat. No. 5,716,883, describes a fabrication method for a crown shaped capacitor structure, while Lou, et al, in U.S. Pat. No. 5,597,754, describe a method for forming an HSG silicon layer, for a DRAM storage node structure. However none of the prior art describe the process used in the present invention, in which a disposable silicon oxide layer is used as an isolation region, between capacitor structure, thus increasing the selectivity between HSG silicon, and the isolation layer, nor does the prior art describe a post - HSG silicon, disposable silicon oxide layer, resulting in a corner, comprised of a vertical feature of the crown shaped structure, and the isolation region, more conducive to the formation of a capacitor dielectric layer.

SUMMARY OF THE INVENTION

It is an object of this invention to create a DRAM capacitor structure, in which the surface area the storage node structure, of the DRAM capacitor structure, is increased via use of a crown shaped structure, and via use of an HSG silicon layer, on the crown shaped structure.

It is another object of this invention to form a capacitor opening in a composite insulator layer, comprised of an overlying doped silicon oxide layer, and an underlying undoped silicon oxide layer, followed by patterning procedures, amorphous silicon deposition, and a chemical mechanical polishing procedure, forming an amorphous silicon, crown shaped structure, in the capacitor opening.

It is yet another object of this invention to remove the doped silicon oxide component, of the composite insulator layer, exposing only the top portion of the amorphous silicon, crown shaped structure, leaving the undoped silicon oxide component, of the composite insulator layer, still surrounding the bottom portion of the amorphous silicon, crown shaped structure.

It is still yet another object of this invention to selectively form an HSG silicon layer, on the exposed surfaces of the top portion of the amorphous silicon, crown shaped structure.

It is still yet another object of this invention to remove the undoped silicon oxide component, exposing the bottom portion of the amorphous silicon, crown shaped structure, and exposing the silicon nitride component of the composite insulator layer, followed by the formation of a capacitor dielectric layer on both portions of the crown shaped structure.

In accordance with the present invention a method for fabricating a DRAM capacitor structure, with increased capacitance realized via a crown shaped storage node structure, and via use of a selectively formed, HSG silicon layer, on a top portion of an amorphous silicon, crown shaped storage node structure, and featuring the formation of a capacitor dielectric layer, on all portions of the crown shaped storage node structure, has been developed. A transfer gate transistor comprised of: a thin gate insulator; a polysilicon gate structure; a lightly doped source/drain region; insulator spacers on the sidewalls of the polysilicon gate structure; and a heavily doped source/drain regions; are formed on a semiconductor substrate. A first composite insulator layer, featuring an overlying layer of silicon nitride, and an underlying silicon oxide layer, are deposited on the transfer gate transistor region, followed by the creation of a storage node contact hole, in the composite insulator layer, exposing a source region, of the transfer gate transistor. A doped polysilicon plug is formed in the storage node contact hole, contacting the source region of the transfer gate transistor. A capacitor opening in a second composite insulator layer, comprised of a thick, overlying doped silicon oxide layer, and a thin, underlying silicon oxide layer, is made, exposing top surface of the doped polysilicon plug. An amorphous silicon layer is deposited, coating the exposed surfaces of the capacitor opening. After removal of the amorphous silicon layer, from the top surface of the second composite insulator layer, creating an amorphous silicon, crown shaped structure, in the capacitor opening, selective removal of the doped silicon oxide component is performed, exposing a top portion of the amorphous silicon, crown shaped structure, while the undoped component of the second composite insulator layer, remains protecting the bottom portion of the amorphous silicon, crown shaped structure. An HSG silicon layer is next selectively formed only on the exposed surfaces of the top portion of the amorphous silicon, crown shaped structure. Removal of the undoped silicon oxide layer results in a crown shaped storage node structure, in the capacitor opening, overlying and contacting the doped polysilicon plug, with the crown shaped storage node structure comprised of a top portion, featuring an HSG silicon layer surface, and a bottom portion, comprised of a smooth amorphous silicon surface. A capacitor dielectric layer is formed on all surfaces of the crown shaped storage node structure, followed by the creation of an upper polysilicon electrode, completing the formation of a crown shaped stacked capacitor structure.

BRIEF DESCRIPTION OF THE DRAWINGS

The object and other advantages of this invention are best explained in the preferred embodiment with reference to the attached drawings that include.

DESCRIPTION OF THE PREFERRED EMBODIMENTS

The method of forming a DRAM capacitor structure, featuring a crown shaped storage node structure, with an HSG silicon layer selectively formed on a top portion of the crown shaped storage node shape, while a capacitor dielectric layer is formed on all portions of a crown shaped storage node structure, will now be described. The transfer gate transistor, used for the DRAM device, of this invention, will be an N channel device. However this invention, selectively forming an HSG silicon layer on a top portion of a crown shaped storage node shape, used to increase the surface area of the DRAM capacitor, can also be applied to P channel, transfer gate transistor.

Figure 1:
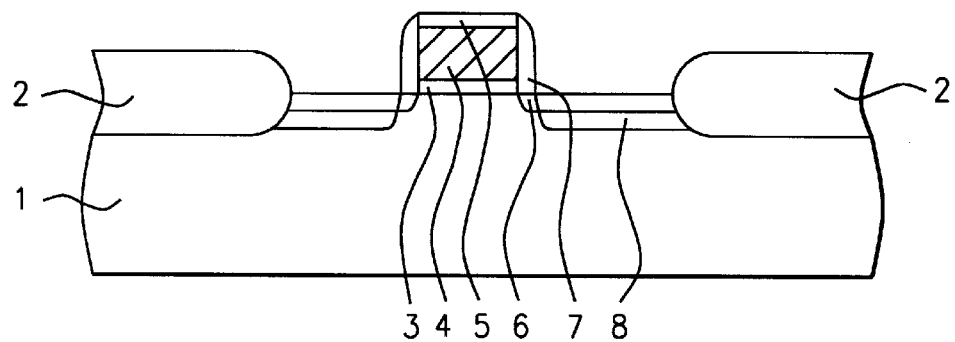
FIGS. 1–12, which schematically, in cross-sectional style, shows the key fabrication stages used in the creation of a DRAM capacitor structure, featuring a crown shaped storage node structure, with an HSG silicon layer selectively formed on a top portion of the crown shaped storage node shape.

Referring to FIG. 1, a P type, semiconductor substrate 1, with a <100>, single crystalline orientation, is used. Field oxide, (FOX), regions 2, are used for purposes of isolation. Briefly the FOX regions 2, are formed via thermal oxidation, in an oxygen-steam ambient, at a temperature between about 750 to 1150° C., to a thickness between about 2000 to 5000 Angstroms. A patterned oxidation resistant mask of silicon nitride-silicon oxide is used to prevent FOX regions 2, from growing on areas of semiconductor substrate 1, to be used for subsequent device regions. After the growth of the FOX regions 2, the oxidation resistant mask is removed via use of a hot phosphoric acid solution for the overlying, silicon nitride layer, and a buffered hydrofluoric acid solution for the underlying silicon oxide layer. If desired, FOX regions 2, can be replaced by insulator filled shallow trenches. This can be accomplished via forming a trench, between about 2000 to 5000 Angstroms in depth, in semiconductor substrate 1, using anisotropic reactive ion etching, (RIE), procedure, using $Cl_2$ as an etchant. A silicon oxide layer, obtained using a low pressure chemical vapor deposition, (LPCVD), or a plasma enhanced chemical vapor deposition, (PECVD), procedure, is used to completely fill the shallow trenches. Unwanted silicon oxide is removed via a anisotropic RIE procedure, or via a chemical mechanical polishing, (CMP), procedure.

After a series of wet cleans, a gate insulator layer 3, comprised of silicon dioxide, is thermally grown in an oxygen-steam ambient, at a temperature between about 750 to 1050° C., to a thickness between about 40 to 200 Angstroms. A first polysilicon layer 4, is next deposited using LPCVD procedures, at a temperature between about 500 to 700° C., to a thickness between about 500 to 4000 Angstroms. The polysilicon layer can either be grown intrinsically and doped via ion implantation of arsenic or phosphorous, or polysilicon layer 4, can be in situ doped during deposition via the incorporation of either arsine or phosphine to the silane, or disilane ambient. If lower word line, or gate resistance is desired, polysilicon layer 4, can be replaced by a polycide layer, comprised of a metal silicide layer, such as tungsten silicide or titanium silicide, residing on an underlying doped polysilicon layer. A silicon oxide layer 5, used as a cap insulator layer, is next grown via LPCVD or PECVD procedures, to a thickness between about 600 to 2000 Angstroms. Conventional photolithographic and reactive ion etching, (RIE), procedures, using $CHF_3$ as an etchant for silicon oxide layer 5, and using $Cl_2$ as an etchant for polysilicon or polycide layer 4, are used to create the gate structure, with overlying cap insulator layer 5, shown schematically in FIG. 1. Removal of the photoresist shape, used for the definition of the gate structure, is accomplished via plasma oxygen ashing and careful wet cleans.

A lightly doped source/drain region 6, is next formed via ion implantation of phosphorous, at an energy between about 5 to 60 KeV, at a dose between about 1E13 to 1E15 atoms/cm$^2$. Another silicon oxide layer is then deposited, using either LPCVD or PECVD procedures, at a temperature between about 400 to 850° C., to a thickness between about 500 to 4000 Angstroms, followed by an anisotropic RIE procedure, using $CHF_3$ as an etchant, creating insulator spacers 7, located on the sides of gate structure 6. A heavily doped source/drain region 8, is then formed via ion implantation of arsenic, at an energy between about 10 to 100 KeV, at a dose between about 1E14 to 5E16 atoms/cm$^2$. The result of these procedures are again schematically shown in FIG. 1.

Figure 2:
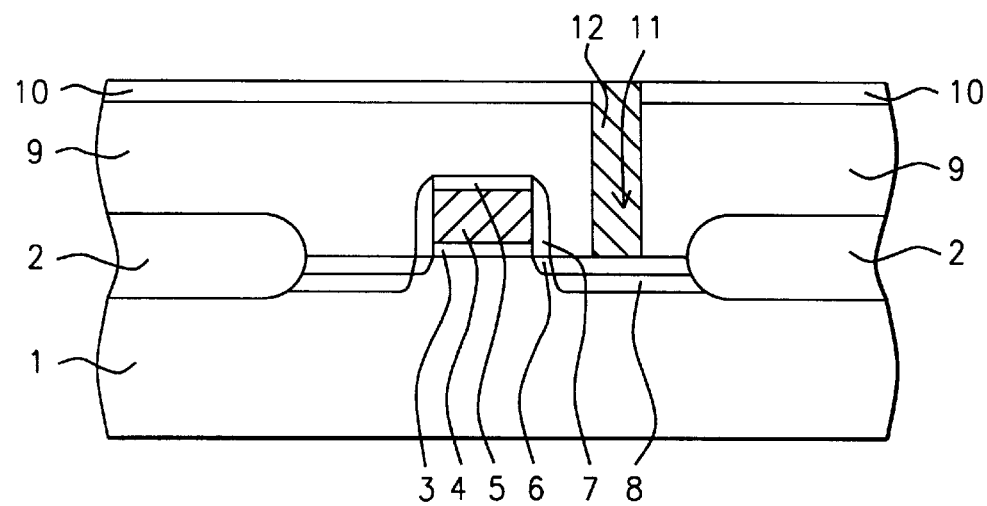

An insulator layer 9, of either silicon oxide, or borophosphosilicate glass, (BPSG), is next deposited via LPCVD, PECVD, or sub-atmospheric chemical vapor deposition, (SACVD), procedures, to a thickness between about 1000 to 8000 Angstroms. A chemical mechanical polishing, (CMP), procedure is next used to planarize insulator layer 9. If a BPSG layer is used, a reflow procedure, performed at a temperature between about 700 to 1000° C., is employed to create a smoother the top surface topography for the BPSG layer. A silicon nitride layer 10, is next deposited, via LPCVD or PECVD procedures, to a thickness between about 50 to 1000 Angstroms. Conventional photolithographic and RIE procedures, using $CF_4$ as an etchant for silicon nitride layer 10, and using $CHF_3$ as an etchant for insulator layer 9, are used to open storage node contact hole 11, in the composite insulator layer, exposing the top surface of heavily doped source/drain region 8. This is schematically shown in FIG. 2. Removal of the photoresist shape, used as an etch mask for the creation of storage node contact hole 11, is performed via use of plasma oxygen ashing and careful wet cleans. A polysilicon layer is next deposited, using LPCVD procedures, at a thickness between about 1000 to 6000 Angstroms. The polysilicon layer is in situ doped, during deposition, via the addition of arsine, or phosphine, to a silane, or disilane ambient, resulting in a bulk concentration for the polysilicon layer, between about 1E19 to 1E21 atoms/cm$^3$. The formation of doped polysilicon plug 12, in storage node contact hole 11, shown schematically in FIG. 2, is accomplished via removal of unwanted polysilicon, from the top surface of silicon nitride layer 10, using either an anisotropic RIE procedure, using $Cl_2$ as an etchant, or using a CMP procedure.

Figure 3:
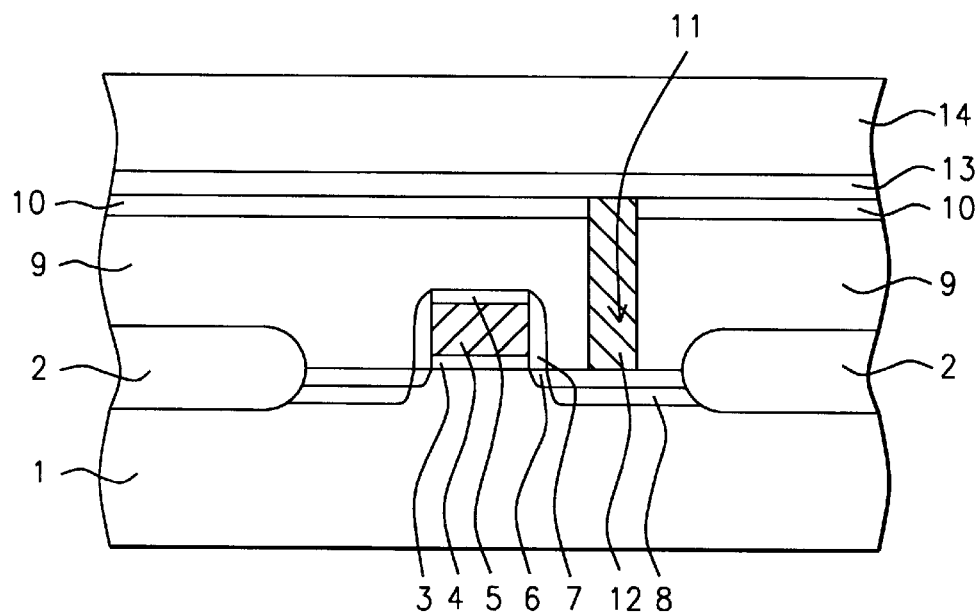
Figure 4:
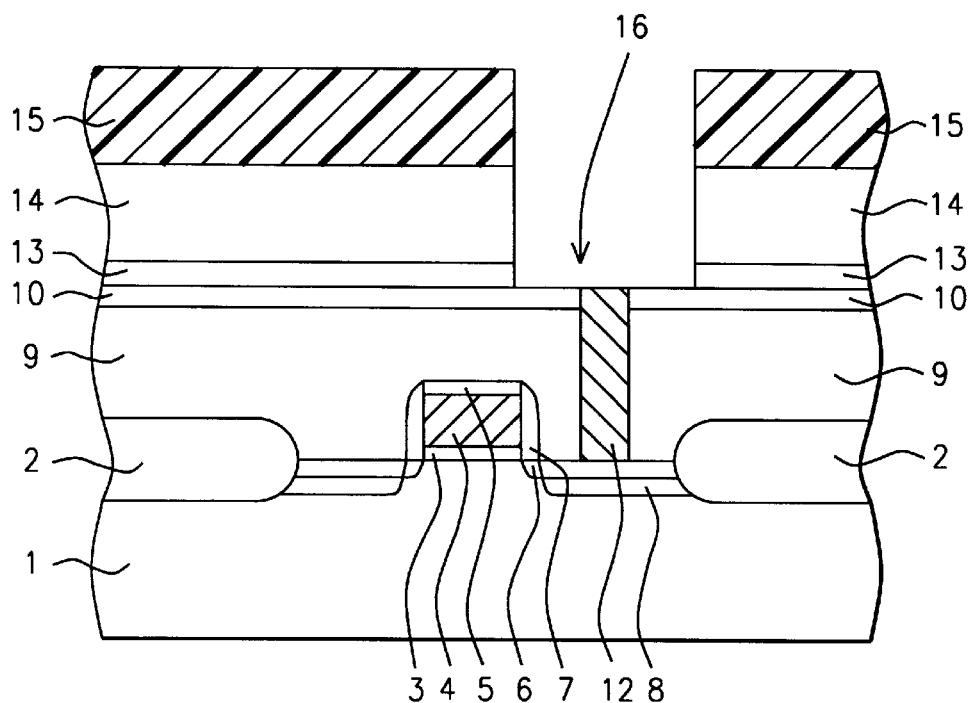

A critical aspect of this invention, the creation of a capacitor opening, in a composite insulator layer, presenting the shape needed to create a crown shaped structure, is next addressed, and described schematically in FIGS. 3–4. An undoped layer of silicon oxide 13, is deposited, via LPCVD, PECVD, or high density plasma, (HDP), procedures, to a thickness between about 100 to 5000 Angstroms, using tetraethylorthosilicate, (TEOS), as a source. A doped silicon oxide layer 14, such as phosphosilicate glass, (PSG), comprised of $P_2O_5$ in $SiO_2$, or boro-phosphosilicate glass, is next deposited, again via LPCVD, PECVD, or HDP procedures, to a thickness between about 5000 to 10000 Angstroms, via the addition of phosphine, or phosphine and diborane, to a TEOS source. The composite insulator layer shown schematically in FIG. 3, could be deposited sequentially, in the same system, or in separate systems, if desired. A photoresist shape 15, is then used as a mask, to allow an anisotropic RIE procedure, using $CHF_3$ as an etchant, to create capacitor opening 16, in the composite insulator layer, comprised of overlying, doped silicon oxide layer 14, and underlying, undoped silicon oxide layer 13, exposing the top surface of doped polysilicon plug 12, as well as exposing a portion of the top surface of silicon nitride layer 10. This is schematically described in FIG. 4. Photoresist shape 15, is removed via plasma oxygen ashing and careful wet cleans.

Figure 5:
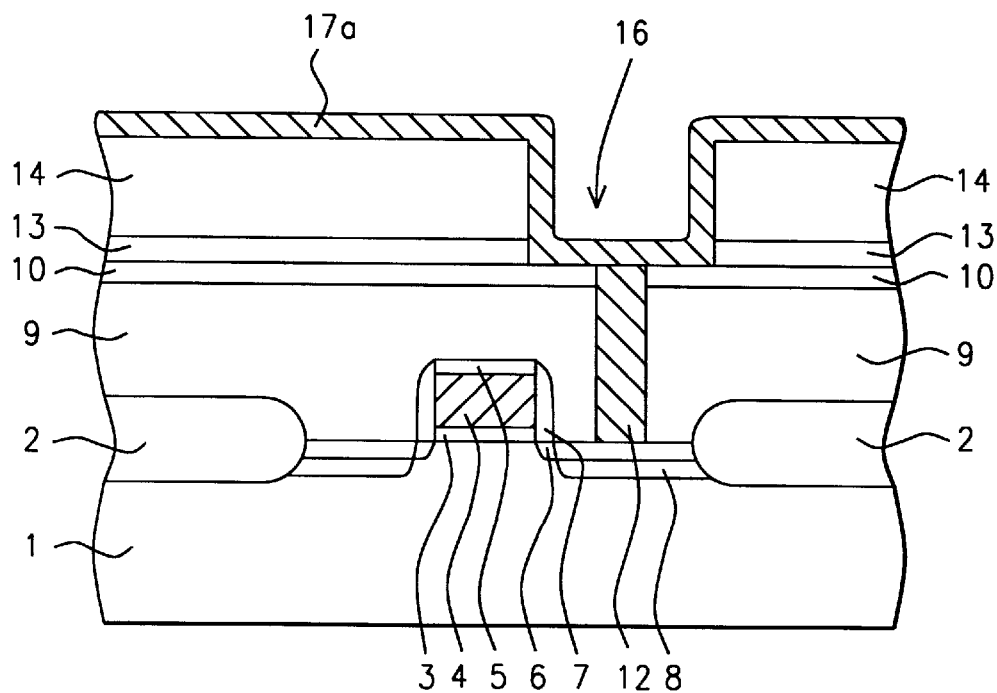
Figure 6:
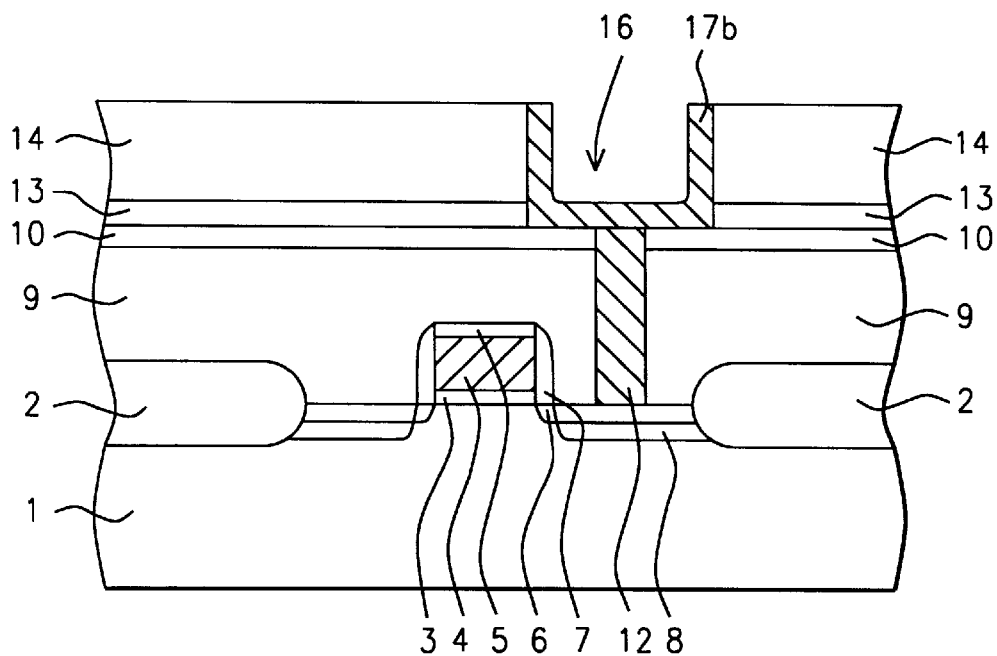

An amorphous silicon layer 17a, shown schematically in FIG. 5, is next deposited using LPCVD procedures, at a temperature below 550° C., to a thickness between about 200 to 1000 Angstroms, using silane, or disilane as a source. Amorphous silicon layer 17a, can be lightly doped, in situ, during the deposition procedure, via the addition of phosphine to a silane, or to a disilane, ambient, resulting in a bulk concentration, for lightly doped amorphous silicon layer 17a, between about 1E19 to 4E20 atoms/cm$^3$. A chemical mechanical polishing, (CMP), procedure is then employed to remove amorphous silicon layer 17a, from the top surface of doped silicon oxide layer 14, resulting in the creation of crown shaped storage node shape 17b, shown schematically in FIG. 6, comprised of amorphous silicon vertical features, on the sides of the composite insulator layer, in capacitor opening 16, connected by a horizontal amorphous silicon feature, located at the bottom of capacitor opening 16, and contacting the top surface of doped polysilicon plug 12.

Figure 7:
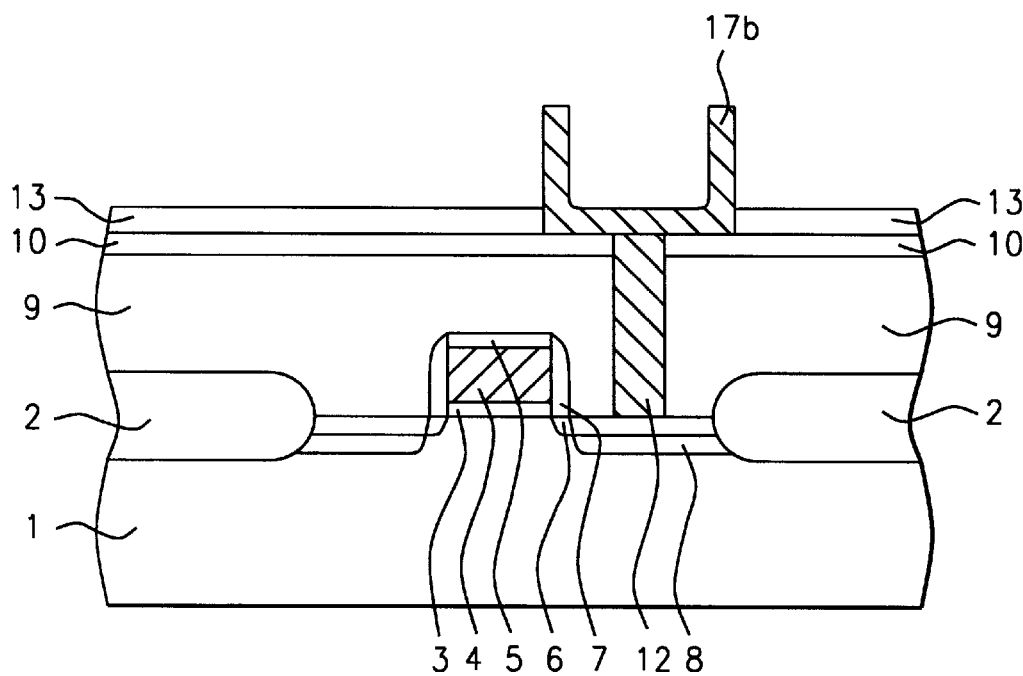

Selective removal of doped silicon oxide layer 14, is next addressed via a hydrofluoric, or a buffered hydrofluoric acid solution, which removes doped silicon oxide layer 14, at a rate between about 20 to 1000 times faster than the removal rate of undoped silicon oxide layer 13. Doped silicon oxide layer 14, can also be removed via vapor hydrofluoric, with or without the incorporation of water vapor in a low pressure system, at a temperature between about 20 to 1050° C., at a pressure below 1 torr, for a time between about 10 sec. to 10 min., using a vapor hydrofluoric gas flow between about 15 to 500 sccm, and using a water vapor flow rate between about 10 to 1000 sccm. The importance of this procedure, is to expose only a top portion of the vertical features of crown shaped storage node shape 17b, leaving the bottom portion still protected by undoped silicon oxide layer 13, and more importantly leaving isolation regions of undoped silicon oxide layer 13, in areas not covered by crown shaped storage node shape 17b, overlying silicon nitride layer 10. This is schematically shown in FIG. 7.

Figure 8:
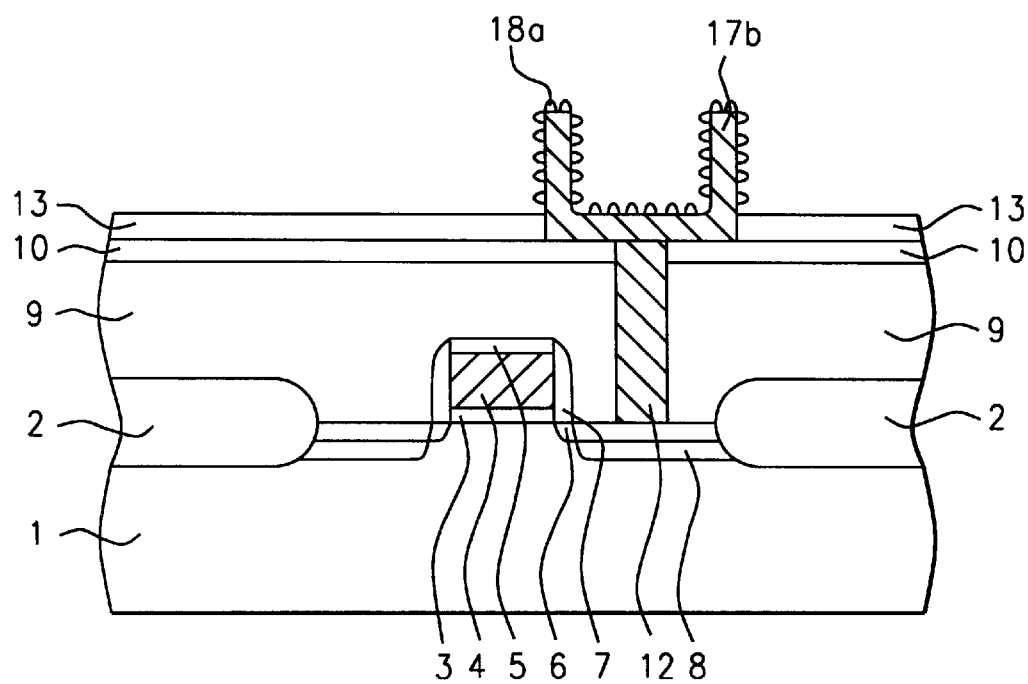
Figure 9:
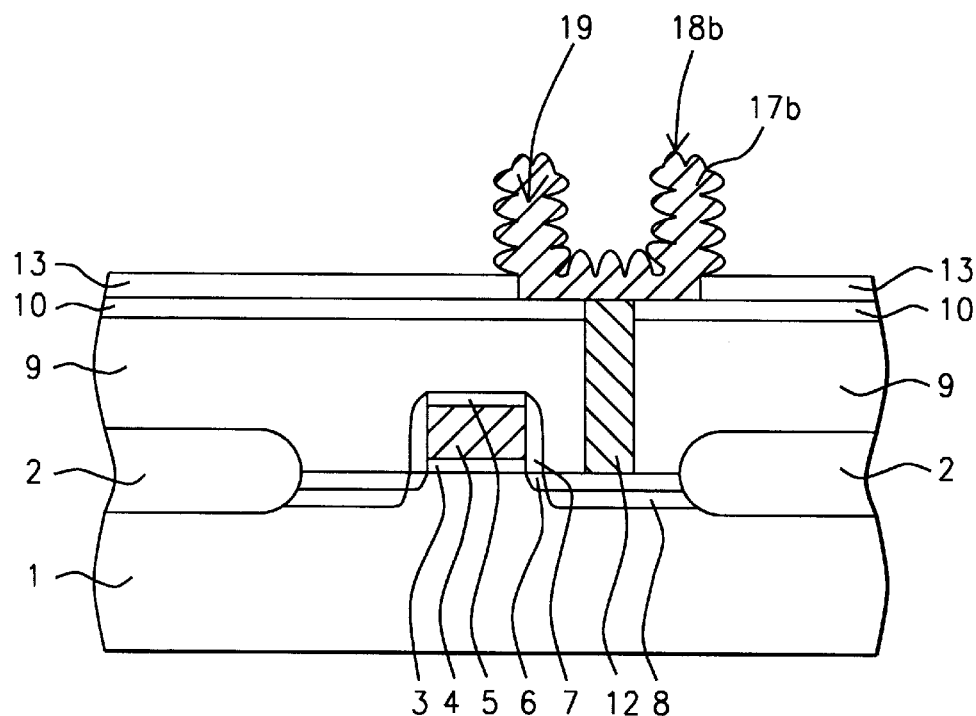

The selective formation of an HSG silicon layer, is next addressed, and schematically shown in FIGS. 8–9. First, HSG silicon seeds 18a, shown schematically in FIG. 8, are selectively grown on the top portion, or the portion of crown shaped storage node shape 17b, not covered by undoped silicon oxide layer 13. This is accomplished via LPCVD, or UHVCVD, (ultra high vacuum CVD), procedures, at a temperature between about 550 to 800° C., at a pressure below 1.0 torr, for a time between about 10 sec to 120 min., and using a silane, or a disilane flow concentration below 1.0E-3 moles/m$^3$. The rate of formation of HSG silicon seeds on undoped silicon oxide layer 13, at the above conditions, is less than the rate of formation of HSG silicon seeds on silicon nitride. Therefore the presence of crown shaped storage node shape 17b, surrounded by undoped silicon oxide layer 13, results in increased selectivity of HSG silicon formation, on the amorphous silicon surface of the crown shaped structure, when compared to counterparts in which a crown shaped storage node shape is surrounded by silicon nitride. An anneal cycle is next performed, in situ, in the same LPCVD or UHVCVD system, forming HSG silicon layer 18b, from HSG silicon seeds 18a, and from a portion of the crown shaped storage node shape, resulting in the crown shaped storage node structure 19, shown schematically in FIG. 9, comprised of HSG silicon layer 18b, on a crown shaped storage node shape 17b. The anneal cycle is performed at a temperature between about 550 to 800° C., at a pressure below 1.0 torr, for a time between about 0 to 120 min, in a nitrogen ambient, forming HSG silicon layer 18b, via consumption of HSG silicon seeds 18a, and of consumption of a portion of the lightly doped amorphous silicon layer 17a, of crown shaped storage node shape 17b.

Figure 10:
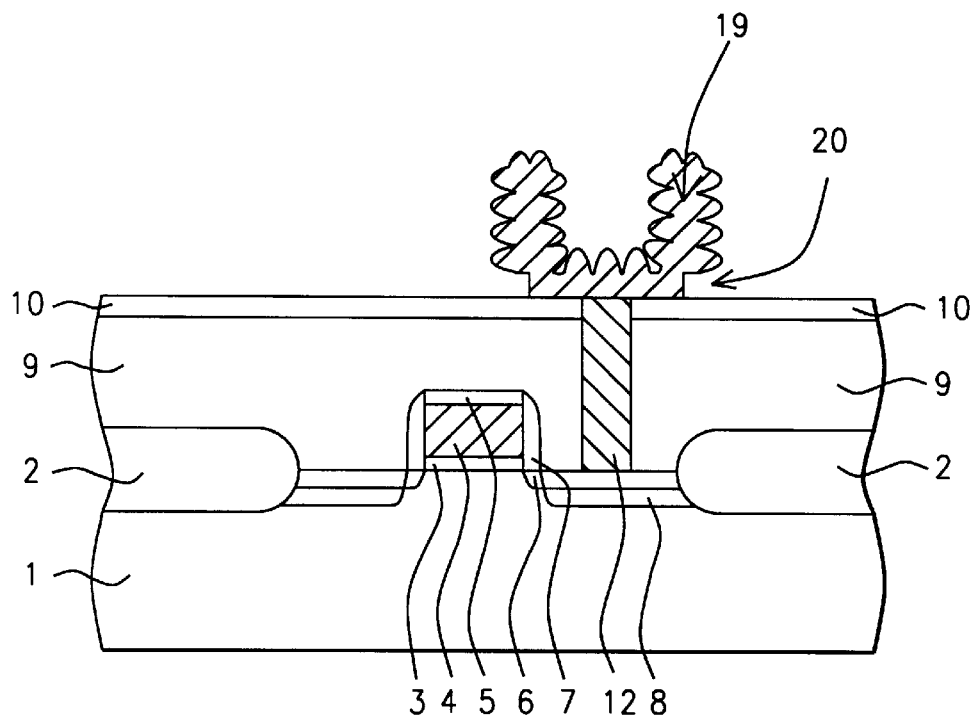

Removal of undoped silicon oxide layer 13, is next performed, via use of a buffered hydrofluoric acid solution, resulting in exposure of a bottom portion, of crown shaped storage node structure 19. Bottom portion 20, shown schematically in FIG. 10, featuring a smooth, or non-HSG silicon surface, interfaces underlying silicon nitride layer 10, at about a 90° angle, allowing reduced complexity to exist, when forming a subsequent capacitor dielectric layer, specifically at the 90° corner. For example if HSG silicon layer, interfaced underlying silicon nitride layer 10, the angle at this corner could be less than 90°, presenting a difficult corner, region in which to form a capacitor dielectric layer. Therefore the use of the composite insulator layer, doped silicon oxide layer 14—undoped silicon oxide layer 13, not only offered increased selectivity of HSG silicon formation, but also decreased the difficulties of forming a capacitor dielectric layer at the bottom corner of the crown shaped storage node structure. In addition if a NO, (oxidized silicon), capacitor dielectric layer is used, the desired conformality of the deposited silicon nitride component of the NO layer, would be difficult to achieve at the corner of the HSG, and undoped silicon oxide layer 13, if silicon oxide layer had not been removed.

Figure 11:
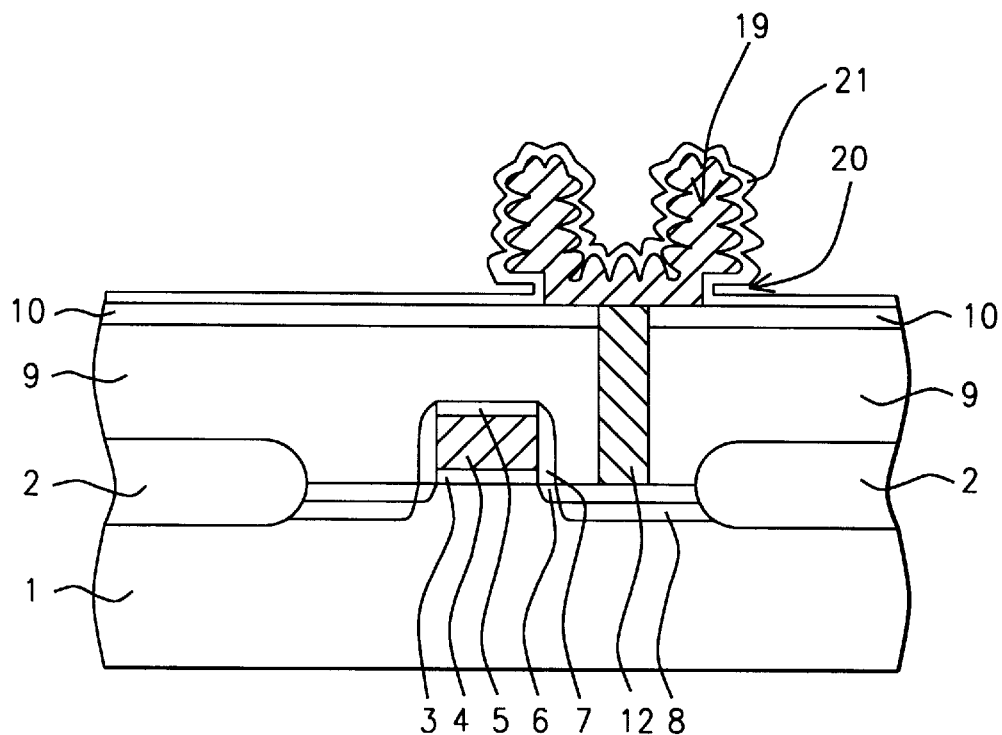
Figure 12:
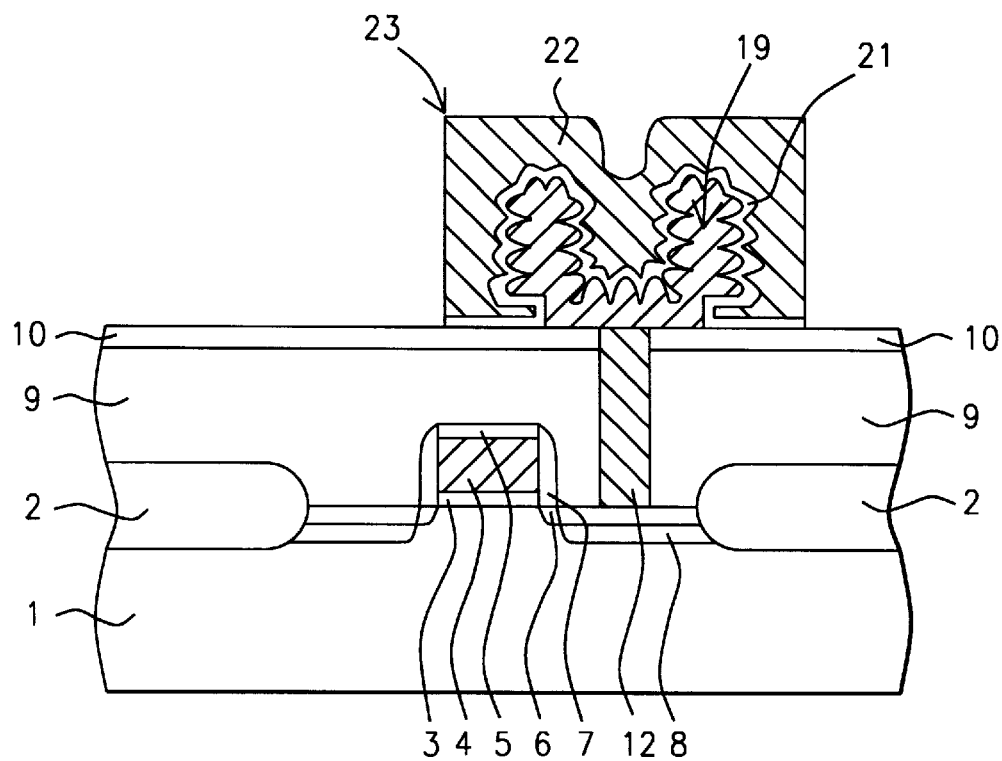

A capacitor dielectric layer 21, such as NO, is next formed on crown shaped storage node structure 19. First a silicon nitride layer is deposited via LPCVD or PECVD procedures, to a thickness between about 30 to 100 Angstroms, depositing on the HSG silicon surface, as well as on the smooth surface, in region 20, of crown shaped storage node structure 19, in addition to deposition on the top surface of silicon nitride layer 10. Next a thermal oxidation procedure, performed in an oxygen-steam ambient, at a temperature between about 750 to 1000° C., is used to convert a top portion of the silicon nitride layer to silicon oxide, resulting in the NO, or oxidized silicon nitride, capacitor dielectric layer 21, shown schematically in FIG. 11, at an equivalent silicon oxide thickness between about 15 to 80 Angstroms. Again the complexity of the formation of capacitor dielectric layer 21, was reduced via use of a bottom portion of crown shaped storage node structure, featuring a smooth surface. Finally another layer of polysilicon is deposited, via LPCVD procedures, to a thickness between about 1000 to 2000 Angstroms. Doping of this polysilicon layer is accomplished using the in situ doping, deposition procedure, via the addition of phosphine to a silane, or disilane ambient. Photolithographic and RIE procedures, using Cl$_2$ as an etchant, are next employed to create polysilicon upper electrode, or plate electrode 22, shown schematically in FIG. 12. Photoresist is again removed via plasma oxygen ashing and careful wet cleans, resulting in DRAM capacitor structure 23, comprised of polysilicon upper electrode 22, capacitor dielectric layer 21, and crown shaped storage node structure 19.

While this invention has been particularly shown and described with reference to the preferred embodiments thereof, it will be understood by those skilled in the art that various changes in form and details may be made without departing from the spirit and scope of this invention.

What is claimed is:

1. A method of fabricating a capacitor structure, for a dynamic random access memory, (DRAM), device, on a semiconductor substrate, comprised the steps of:

providing an underlying transfer gate transistor, comprised of a gate structure, on a gate insulator layer, insulator spacers on the sides of said gate structure, and a source/drain region in an area of said semiconductor substrate, not covered by said gate structure;

forming a storage node contact hole, in a first composite insulator layer, exposing the top surface of a source region;

forming a doped polysilicon plug, in said storage node contact hole;

depositing a second composite insulator layer, comprised of a thick overlying insulator layer, and of a thin underlying insulator layer;

selectively forming a capacitor opening in said second composite insulator layer, exposing the top surface of said doped polysilicon plug, with the selective opening procedure used for said capacitor opening, terminating on, and exposing, a portion of the top surface of an overlying insulator layer component of said first composite insulator layer;

depositing a silicon layer on the top surface of said second composite insulator layer, on the sides of said second composite insulator layer, exposed in said capacitor opening, and on the top surface of said doped polysilicon plug, exposed at the bottom of said capacitor opening;

selectively removing said silicon layer from the top surface of said second composite insulator layer, via a selective chemical mechanical polishing procedure, resulting in a crown shaped structure, in said capacitor opening, comprised of vertical silicon features, on the sides of said capacitor opening, connected to a horizontal silicon feature, located at the bottom of said capacitor opening, with said horizontal silicon feature overlying, and contacting, said doped polysilicon plug;

selectively removing said thick overlying insulator layer, exposing a top portion of said crown shaped structure, with a bottom portion of said crown shaped structure still surrounded by said thin underlying insulator layer;

selectively depositing hemispherical grain, (HSG), silicon seeds, on the surface of said top portion of said crown shaped structure;

performing an anneal cycle to selectively create an HSG silicon layer, on said top portion of said crown shaped structure, via consumption of said HSG silicon seeds, and via consumption of a portion of said crown shaped structure;

selectively removing said thin, underlying insulator layer, from the top surface of said first composite insulator layer, exposing smooth surface of said bottom portion of said crown shaped structure, and the top surface of said first composite insulator layer, resulting in a crown shaped storage node structure, comprised of said top portion of said crown shaped structure, with an HSG silicon layer surface, and comprised of said bottom portion, of said crown shaped structure, comprised with a smooth surface;

forming a capacitor dielectric layer on said crown shaped storage node structure; and forming an upper plate electrode, for said capacitor structure.

2. The method of claim 1, wherein said first composite insulator layer is comprised of an underlying layer of silicon oxide, or of a boro-phosphosilicate glass, deposited via LPCVD, PECVD, or SACVD procedures, to a thickness between about 1000 to 8000 Angstroms, and comprised of an overlying silicon nitride layer, obtained via LPCVD or PECVD procedures, at a thickness between about 50 to 1000 Angstroms.

3. The method of claim 1, wherein said doped polysilicon plug is formed from a polysilicon layer, obtained using LPCVD procedures, to a thickness between about 1000 to 6000 Angstroms, and in situ doped during deposition, via the addition of phosphine or arsine, to a silane, or disilane ambient, resulting in a bulk concentration for said doped polysilicon plug between about 1E19 to 1E21 atoms/cm$^3$.

4. The method of claim 1, wherein said thin underlying insulator layer, of said second composite insulator layer, is an undoped silicon oxide layer, obtained using either LPCVD, PECVD, or HDP, procedures, to a thickness between about 100 to 5000 Angstroms, using TEOS as a source.

5. The method of claim 1, wherein said thick overlying insulator layer, of said second composite insulator layer, is a doped silicon oxide layer, such as phosphosilicate glass, or boro-phosphosilicate glass, obtained using either LPCVD, PECVD, or HDP, procedures, to a thickness between about 5000 to 10000 Angstroms, with the addition of phosphine, or phosphine and diborane, to a TEOS flow.

6. The method of claim 1, wherein said silicon layer, is a lightly doped amorphous silicon layer, obtained using LPCVD procedures, at a temperature below 550° C., to a thickness between about 200 to 1000 Angstroms, and in situ doped during deposition, via the addition of phosphine, to a silane, or disilane source, with lightly doped amorphous silicon layer having a bulk concentration between about 1E19 to 4E20 atoms/cm$^3$.

7. The method of claim 1, wherein said thick overlying insulator layer, of said second composite insulator layer, is selectively removed, using a buffered hydrofluoric acid solution, or vapor hydrofluoric gas, with a removal rate ratio of said thick overlying insulator layer, to said thin underlying insulator layer, of about 20 to 1000 .

8. The method of claim 1, wherein said HSG silicon seeds are selectively deposited using an LPCVD, or a UHVCVD procedure, at a temperature between about 550 to 800° C., at a pressure below 1.0 torr, for a time between about 10 sec to 120 min., using a silane or a disilane flow concentration below 1.0E-3 moles/m$^3$.

9. The method of claim 1, wherein said HSG silicon layer is selectively formed from said HSG silicon seeds, and from a portion of said crown shaped structure, via an anneal procedure, performed at a temperature between about 550 to 800° C., at a pressure below 1.0 torr, and for a time between about 0 to 120 min.

10. The method of claim 1, wherein said thin underlying insulator layer is selectively removed from the top surface of said first composite insulator layer via a buffered hydrofluoric acid solution.

11. The method of claim 1, wherein said capacitor dielectric layer is NO, (oxidized silicon nitride), created by initially depositing a silicon nitride layer, at a thickness between about 30 to 100 Angstroms, followed by a thermal oxidation procedure, performed at a temperature between about 750 to 1000° C., in an oxygen-steam ambient, to convert a top portion of silicon nitride to silicon oxide, and creating said capacitor dielectric layer at an equivalent silicon oxide thickness of between about 15 to 80 Angstroms.

12. A method for fabricating a capacitor structure, for a DRAM device, on a semiconductor substrate, in which a crown shaped storage node structure, features an HSG silicon layer on a top portion of said crown shaped storage node structure, and in which a bottom portion of said crown shaped storage node structure, features smooth surfaces, comprising the steps of:

providing an underlying transfer gate transistor, on said semiconductor substrate, comprised of a gate structure, with insulator spacers on the sides of said gate structure, overlying a silicon dioxide gate insulator layer, and, source/drain regions, in an area of said semiconductor substrate, not covered by said gate structure;

depositing a composite insulator layer, comprised of an underlying silicon oxide layer, and an overlying, first silicon nitride layer;

forming a storage node contact hole in said composite insulator layer, exposing the top surface of the source region, of said source/drain regions;

depositing a doped polysilicon layer, completely filling said storage node contact hole;

removing said doped polysilicon layer, from the top surface of said composite insulator layer, forming a doped polysilicon plug, in said storage node contact hole;

depositing an undoped silicon oxide layer, on the top surface of said first silicon nitride layer, and on said top surface of said doped polysilicon plug;

depositing a doped silicon oxide layer on said undoped silicon oxide layer;

selectively forming a capacitor opening in said doped silicon oxide layer, and in said undoped silicon oxide layer, exposing the top surface of said doped polysilicon plug, with the capacitor opening procedure terminating on, and exposing, a top portion of said first silicon nitride layer;

depositing an amorphous silicon layer, on the top surface of said doped silicon oxide layer, and on exposed surfaces of said capacitor opening;

removing said amorphous silicon layer from the top surface of said doped silicon oxide layer, via a selective chemical mechanical polishing procedure, creating an amorphous silicon, crown shaped structure, in said capacitor opening, comprised of vertical amorphous silicon features, on the sides of said doped silicon oxide, and on the sides of said undoped silicon oxide, exposed in said capacitor opening, and comprised of a horizontal amorphous silicon feature, located at the bottom of said capacitor opening, overlying said doped polysilicon plug, and connecting said vertical amorphous silicon features;

selectively removing said doped silicon oxide layer from the top surface of said undoped silicon oxide layer, via procedures which result in a removal rate for said doped silicon oxide layer between about 20 to 1000 times greater than the removal rate of said undoped silicon oxide layer, resulting in exposure of a top portion of said amorphous silicon, crown shaped structure, with a bottom portion of said amorphous silicon, crown shaped structure, surrounded by said undoped silicon oxide layer;

selectively depositing HSG silicon seeds on the surface of said top portion of said amorphous silicon crown shaped structure;

selectively forming an HSG silicon layer, on said top portion of said amorphous silicon, crown shaped structure, via consumption of said HSG silicon seeds and via consumption of a portion of said amorphous silicon, crown shaped structure;

selectively removing said undoped silicon oxide layer, from the top surface of said first silicon nitride layer, resulting in said crown shaped storage node structure, comprised of said top portion of said amorphous silicon, crown shaped structure, featuring an HSG silicon layer, located on the surface of the top portion of said amorphous silicon, crown shaped structure, and comprised of said bottom portion of amorphous silicon, crown shaped structure, featuring smooth surfaces;

depositing a second silicon nitride layer;

performing an oxidation procedure, to create a nitride-oxide, (NO), capacitor dielectric layer on said crown shaped storage node structure; and forming a polysilicon upper electrode for said capacitor structure.

13. The method of claim 12, wherein said composite insulator layer is comprised of an underlying layer of either silicon oxide, or boro-phosphosilicate glass, obtained via LPCVD or PECVD procedures, at a thickness between about 1000 to 8000 Angstroms, and is comprised of an overlying layer of silicon nitride, obtained via LPCVD or PECVD procedures, to a thickness between about 50 to 1000 Angstroms.

14. The method of claim 12, wherein said doped polysilicon layer, used for said doped polysilicon plug, is obtained using LPCVD procedures, to a thickness between about 1000 to 6000 Angstroms, and doped in situ, during deposition, via the addition of arsine or phosphine, to a silane ambient, resulting in a bulk concentration between, of said doped polysilicon layer, between about 1E19 to 1E21 atoms/cm$^3$.

15. The method of claim 12, wherein said undoped silicon oxide layer is obtained using either LPCVD, PECVD, or HDP procedures, at a thickness between about 100 to 5000 Angstroms, using TEOS as a source.

16. The method of claim 12, wherein said doped silicon oxide layer is a phosphosilicate glass, (PSG), layer, obtained via either LPCVD, PECVD, or HDP procedures, to a thickness between about 5000 to 10000 Angstroms, using TEOS as a source, and using phosphine as a dopant.

17. The method of claim 12, wherein said doped silicon oxide layer is a boro-phosphosilicate glass, (BPSG), layer, obtained via LPCVD, PECVD, SACVD, or HDP procedures, to a thickness between about 5000 to 10000 Angstroms, using TEOS as a source, and using phosphine, and diborane, as dopants.

18. The method of claim 12, wherein said capacitor opening, in said doped silicon oxide layer, and in said undoped silicon oxide layer, is formed via an anisotropic RIE procedure, using $CHF_3$ as an etchant.

19. The method of claim 12, wherein said amorphous silicon layer, is a lightly doped amorphous silicon layer, deposited using LPCVD procedures, to a thickness between about 200 to 1000 Angstroms, and doped in situ, during deposition, via the addition of phosphine to a silane, or to a disilane ambient, resulting in a bulk concentration for said amorphous silicon layer, between about 1E19 to 4E20 atoms/cm$^3$.

20. The method of claim 12, wherein said doped silicon oxide layer is selectively removed using a buffered hydrofluoric acid solution, or using a vapor hydrofluoric gas.

21. The method of claim 12, wherein said HSG silicon seeds are selectively deposited, on said top portion of said amorphous silicon, crown shaped structure, using LPCVD, or UHVCVD procedures, at a temperature between about 550 to 800° C., at a pressure below 1.0 torr, and for a time between about 10 sec. to 120 min, using a silane, or a disilane flow, at a concentration below 1.0E-3 moles/m$^3$, in a nitrogen ambient.

22. The method of claim 12, wherein said HSG silicon layer is selectively formed, from said HSG silicon seeds, and from a portion of said amorphous silicon crown shaped structure, via an anneal procedure, performed at a temperature between about 550 to 800° C., at a pressure below 1.0 torr, for a time between about 0 to 120 min., in a nitrogen ambient.

23. The method.of claim 12, wherein said undoped silicon oxide layer is selectively removed from the top surface of the silicon nitride layer, of said composite insulator layer, using a buffered hydrofluoric acid solution.

24. The method of claim 12, wherein said capacitor dielectric layer, is an oxidized silicon nitride, (NO), layer, at an equivalent silicon oxide thickness of between about 15 to 80 Angstroms, created via initial deposition of said second silicon nitride layer, to a thickness between about 30 to 100 Angstroms, followed by a thermal oxidation procedure, performed at a temperature between about 750 to 1000° C., in an oxygen - steam ambient.

* * * * *